United States Patent [19]
Yoder

[11] Patent Number: 5,281,274
[45] Date of Patent: Jan. 25, 1994

[54] ATOMIC LAYER EPITAXY (ALE) APPARATUS FOR GROWING THIN FILMS OF ELEMENTAL SEMICONDUCTORS

[75] Inventor: Max N. Yoder, Falls Church, Va.

[73] Assignee: The United States of America as represented by the Secretary of the Navy, Washington, D.C.

[21] Appl. No.: 13,386

[22] Filed: Feb. 4, 1993

Related U.S. Application Data

[62] Division of Ser. No. 541,990, Jun. 22, 1990, Pat. No. 5,225,366.

[51] Int. Cl.$^5$ .............................................. C23C 16/46
[52] U.S. Cl. ............................ 118/697; 118/719; 118/723; 118/725; 118/730; 118/724; 118/723 I
[58] Field of Search ............... 118/715, 719, 723, 724, 118/725, 730, 696

[56] References Cited

U.S. PATENT DOCUMENTS

| | | | |
|---|---|---|---|
| 4,058,430 | 11/1977 | Santola et al. | 118/730 X |
| 4,389,973 | 6/1983 | Santola et al. | 118/726 X |
| 4,975,252 | 12/1990 | Nishizawa et al. | 118/724 X |
| 4,993,357 | 2/1991 | Scholz | 118/725 X |

Primary Examiner—Brian E. Hearn
Assistant Examiner—Jonathan D. Baskin
Attorney, Agent, or Firm—Alfons F. Kwitnieski; Thomas E. McDonald; John G. Wynn

[57] ABSTRACT

An apparatus for and a method of growing thin films of the elemental semiconductors (group IVB), i.e., silicon, germanium, tin, lead, and, especially diamond, using modified atomic layer epitaxial (ALE) growth techniques are disclosed. In addition, stoichiometric and non-stoichiometric compounds of the group IVB elements are also grown by a variation of the method according to the present invention. The ALE growth of diamond thin films is carried-out, inter alia, by exposing a plurality of diamond or like substrates alternately to a halocarbon reactant gas, e.g., carbon tetrafluoride ($CF_4$), and a hydrocarbon reactant gas, e.g., methane ($CH_4$), at substrate temperatures between 300 and 650 Celsius. A stepping motor device portion of the apparatus is controlled by a programmable controller portion such that the surfaces of the plurality of substrates are given exposures of at least $10^{15}$ molecules/cm$^2$ of each of the reactant gases. The chemical reaction time to complete the growth of an individual atom layer is approximately $25 \times 10^{-6}$ second.

13 Claims, 5 Drawing Sheets

- CARBON
- HYDROGEN

- CARBON
- HYDROGEN
- FLUORINE

- CARBON
- FLUORINE

- CARBON
- HYDROGEN
- FLUORINE

ATOMIC LAYER EPITAXY (ALE) APPARATUS FOR GROWING THIN FILMS OF ELEMENTAL SEMICONDUCTORS

CROSS-REFERENCE TO RELATED APPLICATION

This is a divisional application of U.S. Ser. No. 07/541,990, filed on Jun. 22, 1990, U.S. Pat. No. 5,225,366.

BACKGROUND OF THE INVENTION

1. Field of the Invention

The present invention relates generally to the atomic layer epitaxial (ALE) growth of thin films of semiconductors, but more particularly it relates to ALE growth of thin films of elemental semiconductors, i.e., silicon, germanium, tin, lead, and, in particular, diamond.

2. Description of the Prior Art

In conventional epitaxial growth systems such as molecular beam epitaxy, plasma-assisted epitaxy, photo-assisted epitaxy, or chemical vapor deposition, the deposited atoms seek their energetically most favorable position relative to one another and the substrate. For this to happen, the surface migration velocity of the deposited species must be sufficient to provide for the smooth and even, i.e., homogenous, growth of a single crystalline film. Energy is required to promote this surface migration velocity. This energy is obtained from the epitaxial process via substrate heat, plasma or photonic supplied energy, or exothermic chemical reactions. If adequate energy is not supplied, the growth will not be single crystalline. The absolute requirement for this energy needed to ensure an adequate surface migration velocity sufficient for a morphologically smooth surface and single crystalline growth limits the minimum temperature at which the film can be grown. As semiconductor device geometries are increasingly diminishing and dimensional tolerances are becoming a fraction of a micrometer, the resultant impurity diffusion created by high growth temperatures can no longer be an accepted mode of operation. Consequently, lower temperature techniques must be devised to nucleate and uniformly grow the semiconductors of interest. The atomic layer epitaxy (ALE) process has been shown to be efficacious in this respect for the processing of compound semiconductors, i.e., semiconductors which contain two or more elements from differing groups (columns) of the periodic table.

The atomic layer epitaxy (ALE) process, as far as could be determined, was first disclosed in U.S. Pat. No. 4,058,430 to Suntola et. al., filed on Nov. 25, 1975, and issued on Nov. 15, 1977. As disclosed in Suntola et. al., the ALE process was thought to be limited to compound semiconductors, but moreover, it was thought to be limited to compounds wherein the bonding energies between like cations and like anions were each less than that of the cation-anion bonding energy. More recently, however, it has been shown that other compounds, e.g., gallium arsenide (GaAs), are also amenable to ALE growth. The ALE process has been shown to have significant advantages in growing uniform layers of epitaxial thin semiconducting films of compound materials and in intrinsically excluding unwanted impurities from these films. As far as is known, however, the ALE process, with or without modifications, has never been used in the prior art to grow thin films of elemental semiconductors. A fortiori, the concept of using the ALE process for the growth of thin films of elemental semiconductors, at first glance, would seem inappropriate because in the traditional ALE process, the growth cyclically alternates between the growth of the cation and the anion species. Consequently, there is a need in the prior art to adapt the ALE process to the growth of thin films of elemental semiconductors, e.g., group IVB (where there are no well defined anion and cation species), while maintaining the traditional attributes of the ALE process.

Artifact diamond, an elemental semiconductor, has been sought for over 100 years. While artifact diamond crystals have been produced since the 1950's, thin films of diamond have only recently become available. Even so, thin films of diamond of semiconducting quality have not been obtained in sufficient quantities to be economically feasible, i.e., they are simply laboratory curiosities. The primary reason for this has been that the diamond surface reconstructs with double carbon, i.e., C=C or pi, bonds which leads to graphitic inclusions. Virtually all of the prior art methods of nucleating, synthesizing and growing diamond films have used high dilutions of atomic hydrogen (obtained from hot filaments or plasmas) to terminate the carbon bonds on the diamond surface to prevent the unwanted double pi bond reconstruction of the diamond surface. Unfortunately, atomic hydrogen bonds very tightly to the diamond surface and is not easily replaced by carbon from a hydrocarbon gas source. The result is inhomogeneity and multiple phase boundaries wherein the crystallites of diamond generally form at various orientations and in the morphology of abrasive sandpaper. Diamond synthesized in this manner also contains impurities from the hot filament or plasma chamber. Such material is not suitable for semiconductor purposes. Consequently, there is a need in the prior art to produce thin films o diamond of semiconducting quality by eliminating graphitic inclusions and process induced impurities, but yet in an economically viable fashion.

To continue, the presence of large quantities of hydrogen during the growth of diamond films has been thought to be absolutely necessary. Without it, diamond films exhibiting the definitive 1332 inverse centimeter RAMAN line have not been grown. Without large quantities of hydrogen, dangling C=C (pi) bonds have formed on the diamond surface. Hydrogen terminates the dangling carbon bonds and prevents the unwanted pi bonding. Hydrogen is also thought to be responsible for the absence of morphologically smooth single crystalline films. The reason for this is that the hydrogen binds to the diamond surface with a bonding strength greater than that of a diatomic C—C ($sp^3$) bond as listed in the TABLE below. Accordingly, excited carbonaceous radicals compete with atomic hydrogen for the available carbon dangling bond sites on the growing diamond surface. Since the lowest free energy state is represented by the hydrogen termination of the diamond surface and not by termination with a carbonaceous radical or a carbon atom, it is indeed amazing that diamond grows at all using the prior art methods.

TABLE

CHEMICAL BOND STRENGTHS OF ELEMENTAL SEMICONDUCTORS RELATED TO ALE GROWTH

| Bond Description | Bond Strength (Kcal/mol) |
|---|---|
| Br—Br | 46.08 |
| C—Br | 95.6 |
| C—N | 174 |

TABLE-continued
CHEMICAL BOND STRENGTHS OF ELEMENTAL SEMICONDUCTORS RELATED TO ALE GROWTH

| Bond Description | | Bond Strength (Kcal/mol) |
| --- | --- | --- |
| C—O | (diatomic) | 256.7 |
| C—O | (as oxygen on diamond) | 86 |
| C=O | | 174 |
| C—C | (diatomic) | 83 |
| C—C | (diamond) | 144 |
| C—H | | 99 |
| C—F | | 117 (107) |
| C—Cl | | 78 |
| C—Si | | 104 |
| Cl—Cl | | 57.87 |
| Cl—Pb | | 73 |
| F—F | | 37.72 |
| F—Si | | 126 |
| F—Cl | | 61.4 |
| F—Sn | | 77 |
| F—Pb | | 75 |
| Ge—Ge | | 65 |
| Ge—O | | 159 |
| H—C | | 80.9 |
| H—Cl | | 103.1 |
| H—F | | 135.8 |
| H—H | | 104.18 |
| H—I | | 71.4 |
| H—Si | | 74.6 |
| H—Ge | | 76.5 |
| I—I | | 36.06 |
| O—H | | 111 |
| Pb—O | | 99 |
| Si—O | | 192 |
| Si—Si | | 76 |
| Sn—O | | 133 |
| Sn—Sn | | 46.7 |

Currently, four different basic methods are used to grow diamond films in the prior art. The methods are (1) the hot filament method (with or without electric field bias), (2) the immersed plasma method, (3) the remote plasma method, and (4) the photo-assisted growth method. Variations and combinations of these methods are also used. All of the methods use carbonaceous gases highly diluted in hydrogen and, therefore, are costly (other methods using ion beams have not demonstrated definitive RAMAN lines). In all of the foregoing methods, only a fraction of the hydrogen molecules are decomposed into atomic hydrogen and these resultant hydrogen atoms are commonly thought to accomplish several functions. First, they extract hydrogen atoms already attached to the diamond surface by forming molecular hydrogen. This is seen in the TABLE above to be an energy efficient action as the H—H bond strength exceeds the C—H bond strength. Second, other hydrogen atoms attach to the nascent dangling carbon surface bonds. If this is not accomplished prior to the denudation of a second and adjacent carbon lattice site, the possibility exists for the formation of an unwanted C=C pi surface bond. Fortunately, there is a time constant associated with the formation of unwanted C=C bonds from the nascently formed adjacent dangling carbon surface bonds. This time constant is not known with great accuracy; however, it is thought to be generally sufficient to allow for the probability of attachment to the dangling surface bond of an sp$^3$-bonded methyl or an acetyl radical necessary for the continuation of diamond growth. Third, the atomic hydrogen is capable of severing a nascent C—CH$_3$ surface bond to form a methane molecule and leave behind a dangling surface bond. This is the process of methanation which is evidenced by the much slower diamond growth rate as the carbonaceous reagent is increasingly diluted in molecular hydrogen. Thus, the probability that a denuded dangling carbon surface bond will be reterminated by a hydrogen atom is 10$^4$ times more probable than its being reterminated by a carbonaceous gas radical. Fourth, the atomic hydrogen is believed to "etch" away any unwanted graphite that may result when unwanted C=C bonds are formed. It is thus seen that the hydrogen termination of the growing diamond surface prevents unwanted C=C bonds and graphite from forming, but that it is energetically favorable for the diamond surface to remain terminated by hydrogen rather than to grow. Hence, the probability of a continuous diamond film growth uninterrupted by hydrogen "inclusions" is energetically remote. A further complication of hydrogen in the growth of diamond is that hydrogen can be incorporated both interstitially (not on lattice sites) and substitutionally (as a replacement for carbon on a diamond lattice site). It is generally thought that the interstitial hydrogen is driven off at temperatures above 650 Celsius. Consequently, there is a need in the prior art to grow single crystalline diamond films in an improved manner such that hydrogen inclusion and, hence, grain boundaries are prevented.

OBJECTS OF THE INVENTION

Accordingly, a principal object of the present invention is to grow thin films of elemental semiconductors, i.e., silicon, germanium, tin, lead, and, especially diamond, by a modification of the atomic layer epitaxy (ALE) method which shall be referred to hereinafter as the extraction/exchange method.

A corollary object of the above object is to grow the thin films of the elemental semiconductors by cyclically exposing their growth surfaces to different reactant gases or by physically cycling the growth surfaces between differing reactant gas sources.

Another object of the present invention is to grow each thin film of the elemental semiconductors to a uniform thickness over a large area.

Yet another object of the present invention is to grow single crystalline thin films of diamond in such a manner that hydrogen inclusion, and, thus, grain boundaries are eliminated.

Still another object of the present invention is to grow single crystalline thin films of diamond so as to prevent the inclusion of graphitic defects and process induced impurities.

A further object of the present invention is to grow thin films of the elemental semiconductors, i.e., group IVB, in a homogenous manner with surfaces that are atomically smooth and morphological.

A corollary object of the above object is to grow single crystalline thin films of diamond wherein the atomically smooth and morphological surfaces are achieved at growth temperatures far below normal, and below the temperature at which surface migration velocity can be relied upon to achieve the foregoing.

Yet a further object of the present invention is to grow thin films of elemental semiconductors wherein substantially 100 per cent nucleation coverage on each atomic layer thereof is achieved at growth temperatures below which surface migration velocity can be relied upon to promote single crystalline growth.

A still further object of the present invention is to grow both stoichiometric and non-stoichiometric compounds of the elemental semiconductors of group IVB by the extraction/exchange method according to the present invention.

SUMMARY OF THE INVENTION

In accordance with the above stated objects, other objects, features and advantages, the present invention has as a primary purpose to improve the fabrication of thin films of the elemental semiconductors, i.e., silicon, germanium, tin, lead, and, especially, diamond. It has a secondary purpose to synthesize both stoichiometric and non-stoichiometric compounds of the group IVB elements.

The essence of the present invention is in adapting the atomic layer epitaxy (ALE) process to the growth of thin films of the aforementioned elemental semiconductors. The modified process is termed the extraction/exchange method. In so doing, all of the traditional attributes of the ALE technology, e.g., layer thickness uniformity over large areas and unwanted impurity exclusion, are maintained. In addition, adapting the ALE process to the epitaxial growth of thin films of diamond also circumvents the unwanted properties of excess hydrogen, i.e., slowing of growth rate and prevention of contiguous films, while retaining the beneficial properties of hydrogen, i.e., carbon dangling bond termination, prevention of unwanted C=C bonds, and "etching" of graphite. Also, the extraction/exchange method of the present invention, permits the growth of non-stoichiometric, artificially structured, group IVB compounds and provides the general advantages of the ALE technology to both stoichiometric and non-stoichiometric compounds of the group IVB elements.

Briefly, according to the method of the present invention, two different sources of reactant gases are chosen for each elemental semiconductor to be grown. One of the sources contains either hydrogen or a hydride gas having molecules composed of hydrogen and an atom(s) of the semiconductor to be processed, e.g., methane ($CH_4$), silane ($SiH_4$), germane ($GeH_4$), stannane ($SnH_4$), while the other source contains either a halogen or a halide gas having molecules composed of a halogen and an atom(s) of the semiconductor to be processed, e.g., carbon tetrafluoride ($CF_4$), silicon tetrachloride ($SiCl_4$), germanium tetrachloride ($GeCl_4$), stannous tetraiodide ($SnI_4$). The halogen is chosen such that its bond strength to hydrogen substantially exceeds that of the elemental semiconductor tetrahedral bond strength, e.g., H—F>C—C, that of the semiconductor to hydrogen bond strength, e.g., H—F>C—H, and that of the semiconductor to halogen bond strength, e.g., H—F>C—F. The halogen is also chosen such that it is too large to readily diffuse into the semiconductor being grown, e.g., fluorine for diamond or silicon carbide (SiC), chlorine for silicon and silicon germanium compounds, bromine for germanium and germanium-tin compounds and iodine for tin and/or lead. Accordingly, hydrogen-halogen extraction processes, inter alia, are used to form elemental semiconductor bonds of the diamond-building crystal structure type in real time and in a manner which for diamond precludes adjacent lattice site C=C bonds from forming, and, thereby precluding unwanted graphite inclusions. The extraction/exchange method, according to the present invention, alternatingly extracts the respective surface-terminating hydrogen or halogen atom(s), abstracts a halogen or hydrogen atom(s) from an impinging gas molecule, forms a new hydrogen-halogen gas molecule, e.g., H—F, and in exchange reterminates the nascently de- nuded surface atom with the gaseous radical formed by the immediately preceeding abstraction. The method of the present invention also precludes grain-inducing hydrogen terminated carbon inclusions by ensuring that all hydrogen is cyclically extracted by a halogen. To reiterate, the present method is applicable to the ALE growth of silicon, germanium, tin and lead, as well as diamond, and to the ALE growth of the group IVB compounds.

BRIEF DESCRIPTION OF THE DRAWINGS

The previously stated objects, other objects, features and advantages of the method according to the present invention will be more apparent from the following more particular description of the preferred embodiments taken in connection with the accompanying drawings, in which.

DESCRIPTION OF THE PREFERRED EMBODIMENTS

Figure 1:
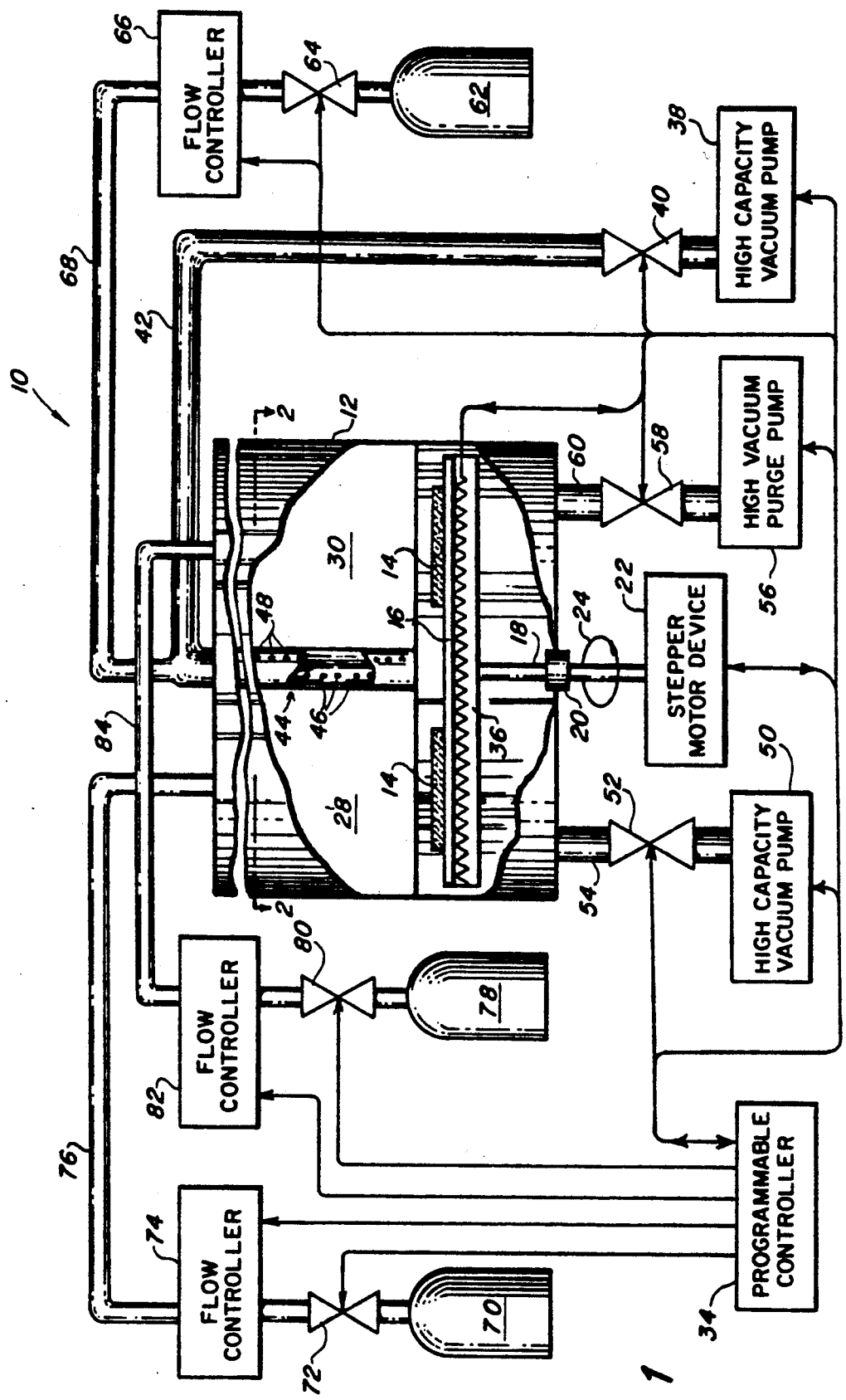
FIG. 1 is a schematic block diagram representation of a growth apparatus suitable for carrying out the method according to the present invention including a partial sectional view of a growth reactor chamber portion thereof and a diamond or other substrate to be processed.
Figure 2:
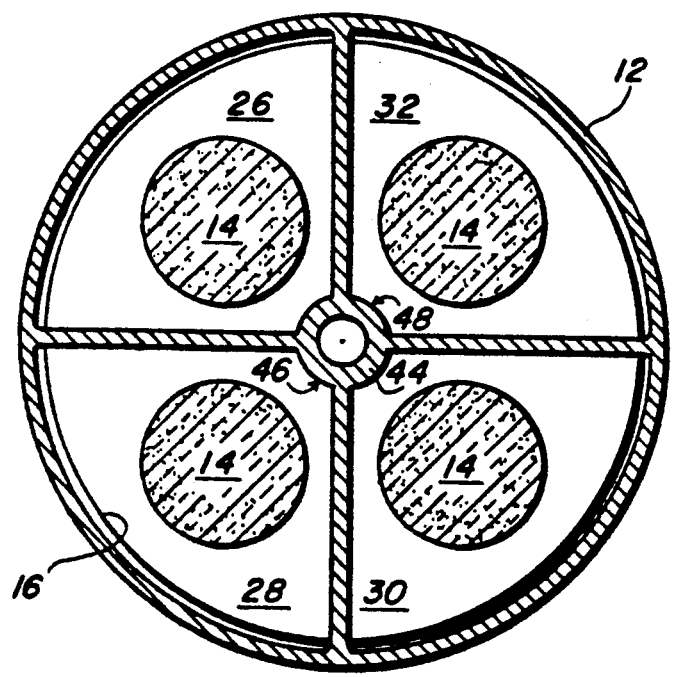
FIG. 2 is a transverse sectional view of the growth reactor chamber portion of FIG. 1 taken along line 2—2 thereof in the direction of the arrows.

Referring to FIGS. 1 and 2 as viewed concurrently, a growth apparatus 10 for performing the extraction/exchange method (modified ALE method), according to the present invention, is shown. As will be explained hereinafter in the section entitled "Statement of the Operation," the growth apparatus 10 can be used to grow single crystalline diamond thin films and amorphous or polycrystalline thin films if desired. Thin films of the group IVB semiconductors, i.e., silicon, germanium, tin and lead can also be grown. The foregoing are the so-called elemental semiconductors. In addition, stoichiometric and non-stoichiometric compounds of the group IVB elements may also be grown by a variation of the method according to the present invention. Stoichiometric compounds are those binary compounds wherein the number of atoms per unit volume of one material is equal to the number of atoms per unit volume of the other material. Non-stoichiometric compounds are compounds not having a one-to-one ratio of their atoms per unit volume. The judicious application of this approach permits the synthesis of artificially structured group IVB materials exhibiting predetermined bandgaps between 0 and 5.5 electron volts (ev).

As better shown in FIG. 1, the growth apparatus 10 includes a growth reactor chamber 12 having a plurality of substrates 14 (the thickness is exaggerated for clarity), upon which the desired thin film is to be grown, secured to a pedestal 16. For purposes of the present invention, the growth reactor chamber 12 is cylindrical and would typically be 8 inches in diameter and 12 inches in height. Each one of the plurality of substrates 14 would typically be 2 inches in diameter. Integrally affixed to the pedestal 16 is a shaft 18 which is sealably and rotatably affixed via a seal/bearing 20 to the growth reactor chamber 12. A stepper motor device 22 is operatively connected to the pedestal shaft 18 for rotation of the pedestal 16 in the direction indicated by directional arrow 24. The stepper motor device 22 includes a position sensor (not shown) for sensing the position of the pedestal 16 relative to a first reactant gas sub-chamber 26, a first vacuum sub-chamber 28, a second reactant gas sub-chamber 30 or a second vacuum sub-chamber 32. The aforementioned sub-chambers 26, 28, 30 and 32 are integrally affixed to the growth reactor chamber 12 (see FIG. 2). A programmable controller 34 receives position information from the stepper motor device 22 and, in turn, drives it according to a predetermined timing and switching sequence. The programmable controller 34 is also operatively connected to a substrate heater device 36 for maintaining the temperature of the plurality of substrates 14 within a predetermined range. The substrate heater device 36 includes a temperature sensor (not shown) for sensing temperature information which is fed back to the programmable controller 34. The programmable controller 34, in turn, drives the substrate heater device 36 so as to maintain the temperature within the predetermined range. The temperature at which the plurality of substrates 14 are maintained depends upon which material is being grown.

Still referring to FIGS. 1 and 2 as viewed concurrently, a first high capacity vacuum pump 38 and its associated control valve 40 are both operatively connected to the top of the growth reactor chamber 12 via a pipeline 42. The pipeline 42 connects to the growth reactor chamber 12 via a tailpipe 44. The tailpipe 44 is integrally affixed to each of the sub-chambers 26, 28, 30 and 32 so as to form a portion thereof. A first plurality of ventholes 46 are configured in the tailpipe 44 so that they exit into the first vacuum sub-chamber 28. Likewise a second plurality of ventholes 48 are configured in the tailpipe 44 so that they exit into the second vacuum sub-chamber 32. These ventholes allow the first high capacity vacuum pump 38 to better maintain the proper operating pressures in the aforementioned vacuum sub-chambers, i.e., at lower operating pressures than the pressures in the reactant gas sub-chambers.

Figure 4:
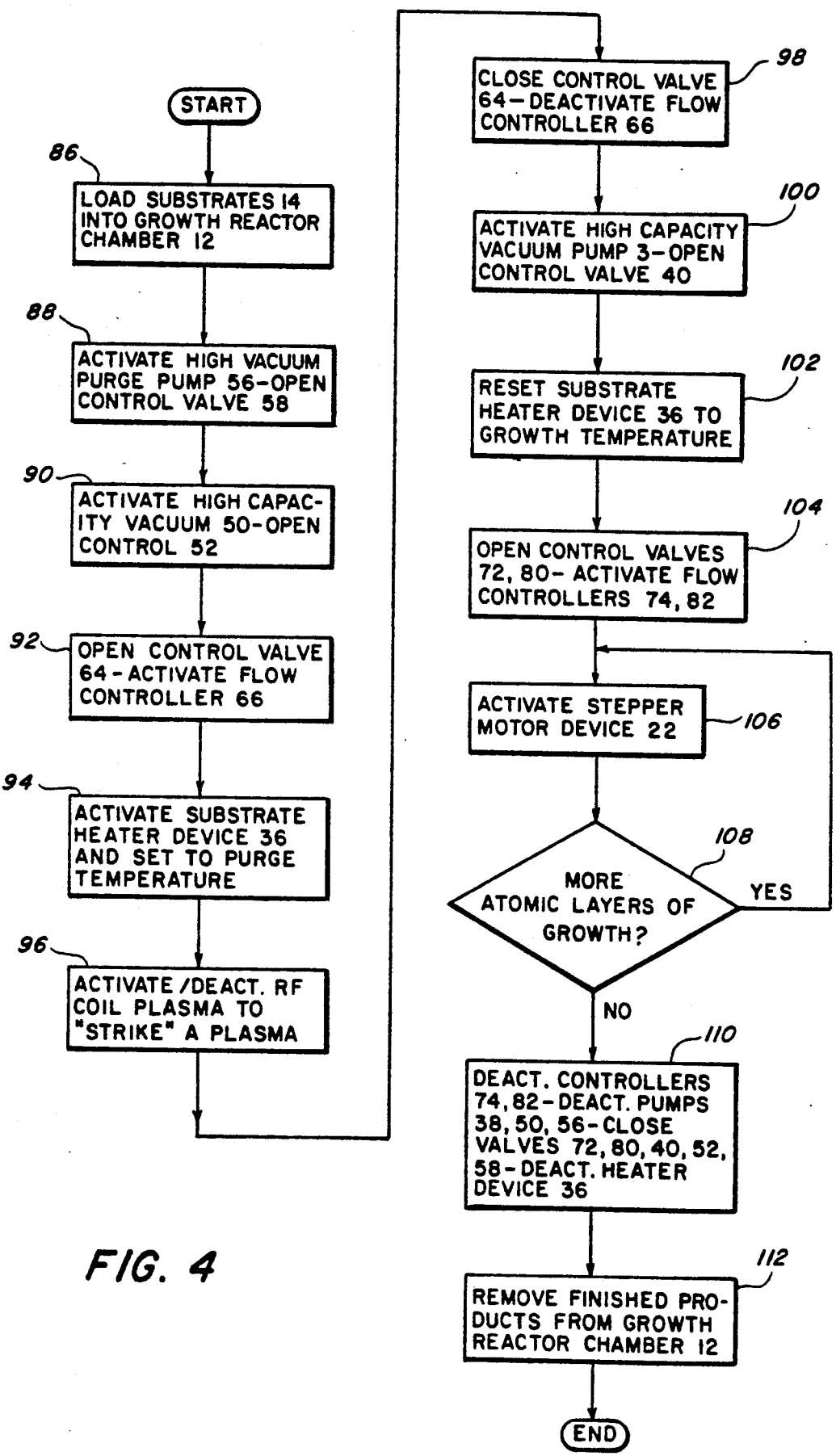
FIG. 4 is a functional block diagram illustrating the essential steps of the method according to the present invention, the functional block diagram also being useful in understanding the operation of the invention and the growth apparatus of FIG. 1.

Referring now to FIG. 1 alone, the growth apparatus 10 further comprises a second high capacity vacuum pump 50 and its associated control valve 52. Both are operatively connected to the bottom of the growth reactor chamber 12 via a pipeline 54. Likewise, a high vacuum purge pump 56 and its associated control valve 58 are operatively connected to the bottom of the growth reactor chamber 12 via a pipeline 60. As shown, the aforementioned pumps and their associated control valves are operatively connected to the programmable controller 34 and, thus, are operated according to a predetermined timing and switching sequence. This predetermined timing and switching sequence for the production of diamond thin films, for example, is disclosed in FIG. 4, which illustrates the essential steps of the method, according to the present invention. FIG. 4 will be discussed hereinafter in the section entitled "Statement of the Operation."

To continue, and still referring to FIG. 1 alone, a purge gas container 62 containing a purge gas, e.g., dry molecular hydrogen ($H_2$), and its associated control valve 64 and flow controller 66 are operatively connected to the top of the growth reactor chamber 12, i.e., to the tailpipe 44, via a pipeline 68 such that each of sub-chambers 26, 28, 30 and 32 and, accordingly, the plurality of substrates 14 can be flooded with the purge gas. As shown, a first reactant gas container 70 containing a reactant gas, e.g., a halide group IVB gas such as $CF_4$ or $SiCl_4$ for a substrate 14 of diamond or silicon, respectively, and its associated control valve 72 and flow controller 74 are operatively connected to the top of the growth reactor chamber 12 via a pipeline 76. Hence, in accordance with the predetermined timing and switching sequence, the first reactant gas sub-chamber 28 and, accordingly, the one of the plurality of substrates 14 therein can be flooded with the first reactant gas. Likewise, a second reactant gas container 78 containing a reactant gas, e.g., a hydride group IVB gas such as $CH_4$ or $SiH_4$ for a substrate 14 of diamond or silicon, respectively, and its associated control valve 80 and flow controller 82 are operatively connected to the top of the growth reactor chamber 12 via a pipeline 84. Hence, in accordance with the predetermined timing and switching sequence, the second reactant gas sub-chamber 30 and, accordingly, the one of the plurality of substrates 14 therein can be flooded with the second reactant gas.

As illustrated in FIG. 1, the programmable controller 34 is also operatively connected to each of the associated control valves and flow controllers 64 and 66, 72 and 74, and 80 and 82, respectively. Accordingly, the timing sequence for diamond ALE growth, ALE growth of group IVB materials and the stoichiometric and non-stoichiometric growth of certain materials to be described hereinafter can be automated to improve the efficiency and yield of thin film products, according to the present invention.

STATEMENT OF THE OPERATION

As shown in FIGS. 1 and 2, the growth apparatus 10 has been configured to efficiently and effectively carry out the method according to the present invention in an automated fashion. However, the present method need not be automated in order to be successfully performed. A simply configured well known gas flow-type ALE reactor (not shown) having a single chamber suitable for processing only a single one of the plurality of substrates 14 at a time can be used to carry out the method of the present invention. It should be mentioned that if the gas flow-type ALE reactor is used, halide molecules (first reactant gas) may adhere to the surface of its single chamber and tend to desorb. This desorption may occur during the hydride (second reactant gas) cycle and interfere with the exchange reaction in such a manner that only a few cycles may be successfully completed. The foregoing problem will be eliminated substantially if the inside surfaces of that type of gas flow-type ALE reactor are coated with polytetrafluoroethylene (which is also known as "TEFLON", a trademark of the E. I. duPont de Nemours & Company, Inc.). The problem of desorption is not evident when the growth apparatus 12 is used to carry out the method of the invention. This advantage is created, inter alia, by configuring the growth reactor chamber 12 to comprise the separate first reactant gas sub-chamber 26, the first vacuum sub-chamber 28, the second reactant gas sub-chamber 30 and the second vacuum sub-chamber 32. The first and second reactant gas sub-chambers 26 and 30 are each dedicated to use by the first and second reactant gases, respectively, and are also separated by the first and second vacuum sub-chambers 28 and 32. As will be discussed in more detail hereinafter, this configuration provides excellent isolation between the steps of the method involving the reactant gases and provides for differential pressures between adjacent sub-chambers.

The following examples are illustrative of the method according to the present invention of the ALE growth of the elemental semiconductors (diamond, silicon, germanium, tin, lead, and combinations thereof). These examples are not intended to limit the scope of the present invention.

EXAMPLE 1

By referring to FIGS. 1, 2 and FIGS. 3a-3d, the general sequence and chemical reactions for diamond ALE growth can best be understood. For single crystalline diamond growth which is necessary for semiconducting electron device grade diamond, the plurality of substrates 14 chosen can be single crystalline diamond as depicted by the lattice schematic diagram(s) for diamond of FIGS. 3a-3d. However, single crystalline substrates having lattice constants closely matched to that of diamond can also be used. Examples are boron doped nickel, copper, berrylium oxide and boron nitride. If single crystalline diamond films are not essential, e.g., for use as optical windows, mirrors, or in tribology, amorphous or polycrystalline substrates of any of the above materials can be used. In addition, a substrate material that forms a carbide can also be used for polycrystalline diamond films, e.g., silicon, titanium and tungsten. Still other non-lattice matched substrates may be used if they are first scratched with diamond powder.

If the plurality of substrates 14 are of high purity, i.e., less than 10 parts per million of foreign inclusions, their surfaces are subjected to a standard degreasing in trichloroethane, acetone, and/or ethanol, followed by "piranha" (organic removing) cleans ($H_2SO_4$ and $H_2O_2$) followed by a standard "RCA clean" such as is routinely used in the semiconductor industry ("RCA" is the trade name of the Radio Corporation of America). The "RCA clean" technique is described in W. Kern, "Cleaning Solutions Based on Hydrogen Peroxide for Use in Silicon Semiconductor Technology", RCA Review, Vol. 31, p. 187 (1970). These cleaning steps are followed by an HF dip immediately prior to insertion into the growth reactor chamber 12. If the plurality of substrates 14 are not of high purity, they must be annealed at high temperature to drive out volatile species and then subjected to surface cleaning in a plasma such as $CF_4$. This process must be repeated until impurities can no longer be detected on the surfaces of the plurality of substrates 14. In all cases, the plurality of substrates 14 must be baked for a sufficient time and at a sufficient temperature to drive out interstitial hydrogen. For single crystalline diamond substrates, the baking temperature should be greater than 650 Celsius for a time greater than 30 minutes.

Figure 3A:
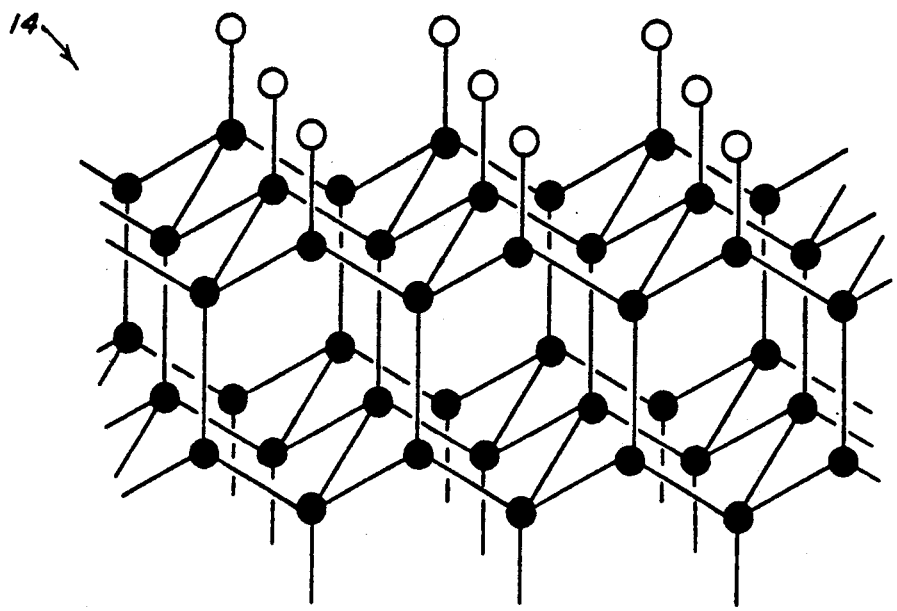
FIG. 3a is a three lattice constants (atoms) wide schematic diagram depiction of the hydrogenated [111] surface of, e.g., the diamond substrate of FIG. 1, which occurs in the processing of thin films of diamond semiconductors in the first step of the method according to the present invention.

After the HF dip, the plurality of substrates 14 are disposed via a load lock (not shown) into the sub-chambers 26, 28, 30 and 32 of the growth reactor chamber 12. The load lock (not shown) is then secured and the growth reactor chamber 12 is evacuated to a pressure of $10^{-8}$ Torr or less by operation of the high vacuum purge pump 56 and its associated control valve 58 to evacuate any residual impurities. This condition is typically set for about 5 minutes after which the plurality of substrates are next cleaned (purged) in a hydrogen plasma (plasma excited molecular hydrogen, $H_2$) from the purge gas container 62 to remove any oxide that may have accumulated and to terminate all dangling surface chemical bonds with atomic hydrogen. The molecular hydrogen (purge gas) from the purge gas container 62 is caused to flow via opening of its associated control value 64 and activation of the flow controller 66 by the programmable controller 34. The flow controller 66 is set to allow a purge gas flow of approximately 100 cc/minute. This purge gas flow rate is not critical and depends upon the size of the growth reactor chamber 12. The purge temperature of the plurality of substrates 14 should be set for diamond. The purge temperature range for diamond is 300 to 650 Celsius. The preferred purge temperature is 300 Celsius for diamond which is the lowest temperature within the range. The proper purge temperature is maintained by the substrate heater device 36 in cooperation with the programmable controller 34. The programmable controller 34 also operates at this time to activate the second high capacity vacuum pump 50 and open its associated control valve 52. The vacuum pump 50 is controlled by the programmable controller 34 to maintain a range of purge pressures between 20 and 100 Torr with a preferred pressure of 40 Torr during the purge operation. In addition, the programmable controller 34 operates to activate a radio frequency (RF) plasma coil device (not shown for clarity) for a period of 30 seconds to "strike" a plasma of the molecular hydrogen after which the RF plasma coil device is deactivated. In so doing and as previously mentioned, the surfaces of the plurality of substrates 14 are cleaned of all oxides and terminated in hydrogen, i.e., hydrogenated as shown in FIG. 3a. For purposes of the present invention, a coil portion (not shown) of the RF plasma coil device is wrapped around the upper portion (top half) of the growth reactor chamber 12. The coil is typically ⅛ inch diameter copper tubing spaced ½ inch apart. A RF generator portion (also not shown) of the RF plasma coil device exites the coil with 1 kW of RF energy centered in the 13.56 MHz band. In the next step, the flowing molecular hydrogen from the purge gas container 62 is cutoff by operation of the programmable controller 34 on the control valve 64. Then the growth reactor chamber 112 is evacuated of molecular hydrogen by operation of the high vacuum purge pump 56 and its associated control valve 58. Care must be taken so as not to expose the surfaces of the plurality of substrates 14 to oxygen. Accordingly, a high vacuum or flowing dry hydrogen environment is required. In the present method, a high vacuum environment is used. The high capacity vacuum pumps 38 and 50 maintain the vacuum environment needed in the growth reactor chamber 12.

Figure 3B:
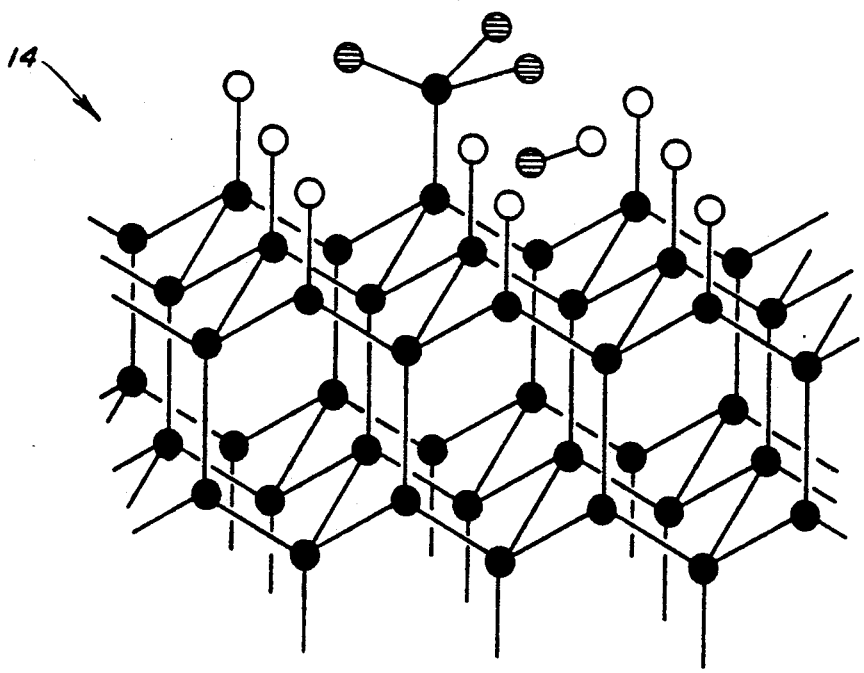
FIG. 3b is the three lattice constants (atoms) wide schematic diagram depiction of FIG. 3a illustrating the first $CF_4$ molecule impinging on the surface thereof, which occurs between the first and second steps of the method according to the present invention.

Referring to FIGS. 1, 2 and 3b, the first high capacity vacuum pump 38 is activated and its associated control valve 40 is opened by operation of the programmable controller 34. Similarly, the control values 72 and 80 are opened and their respective flow controllers 74 and 82 are activated by the programmable controller 34 to set the gas flow rates of the corresponding first and second reactant gas containers 70 and 78 each to 10cc/minute. The gas flow rates are not critical, but must be sufficient to ensure that $10^{15}$ molecules/cm$^2$, contact all portions of the surfaces of the plurality of substrates 14 in the reactant gas sub-chambers 26 and 30. For the processing of diamond substrates, the reactant gas in the first reactant gas container 70 is carbon tetrafluoride ($CF_4$) and the reactant gas in the second reactant gas container 78 is methane ($CH_4$). The temperature of these gases and the previously mentioned purge gas, $H_2$, is nominally room temperature. For purposes of the present invention, the gas flow controllers 66, 74 and 82 may be of the conventional hot filament type wherein the filament temperature and hence its resistence is a function of the gas flow rate.

Figure 3C:
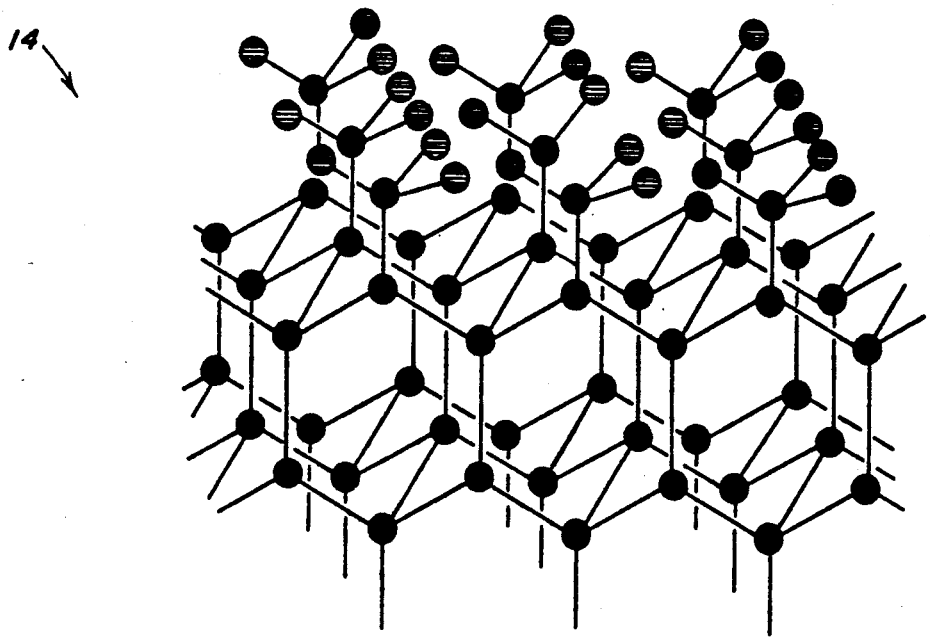
FIG. 3c is the three lattice constants (atoms) wide schematic diagram depiction of FIG. 3b after the surface thereof is completely terminated with $CF_3$, which occurs in the second step of the method according to the present invention.

Consequently and in turn, the hydrogen terminated surface of each of the plurality of substrates 14 is exposed to $CF_4$. The minimum exposure time is dependant on the surface temperature, which is controlled, as aforementioned, by the programmable controller 34 in concert with the substrate heater device 36 such that all of the surface-terminating hydrogen is extracted by chemical processes from each surface. At a growth temperature of 600 Celsius and at a pressure of 40 Torr, the exposure time is typically 600 milliseconds. The maximum exposure time is only limited by system background contamination. In an ultra high vaouum compatible system with "five nines" pure $CF_4$, the maximum exposure time can be several minutes. During this $CF_4$ exposure, several chemical reactions occur. As shown in FIG. 3b, each surface terminating hydrogen atom "transfers its allegiance" to a fluorine atom on a $CF_4$ molecule. The fluorine atom attached to the $CF_4$ molecule in turn 37 transfers its allegiance" to the extracted hydrogen atom to form a gaseous molecule of HF which is evacuated by the vacuum pumps 38, 50 and 56. This leaves a surface atom with a dangling bond and a $CF_4$ radical in close proximity to each other. Each are the closest neighbors of the other. As such, the dangling carbon bond of the nascent $CF_3$ radical bonds to the nascent dangling surface carbon bond. The energy required to break the F atom from the $CF_4$ molecule is approximately 107 kCal/mol. The energy required to denude the crystalline diamond carbon surface of its hydrogen termination is approximately 99 kCal/mol. The total enerqy required for bond breaking is thus 206 kCal/mol. The energy liberated in forming the HF molecule is approximately 135 kCal/mol and the energy liberated in attaching the $CF_3$ radical to the dangling surface carbon atom is approximately 144 kCal/mol. The total energy liberated in this extraction/exchange cycle is thus 279 kCal/mol. The net energy liberated in this cycle is thus 73 kCal/mol and the cycle is seen to be exothermic. One gas molecule entered into the reaction and one was evacuated. Thus, negligible evaporative cooling occurs. After the completion of this step, the surface of each of the plurality of substrates 14 will have grown by exactly one atomic layer of carbon and each surface will be terminated in $CF_3$ radicals as shown in FIG. 3c. Additional $CF_4$ molecules do not react with the surface as there is no longer any hydrogen present to initiate such reaction.

Figure 3D:
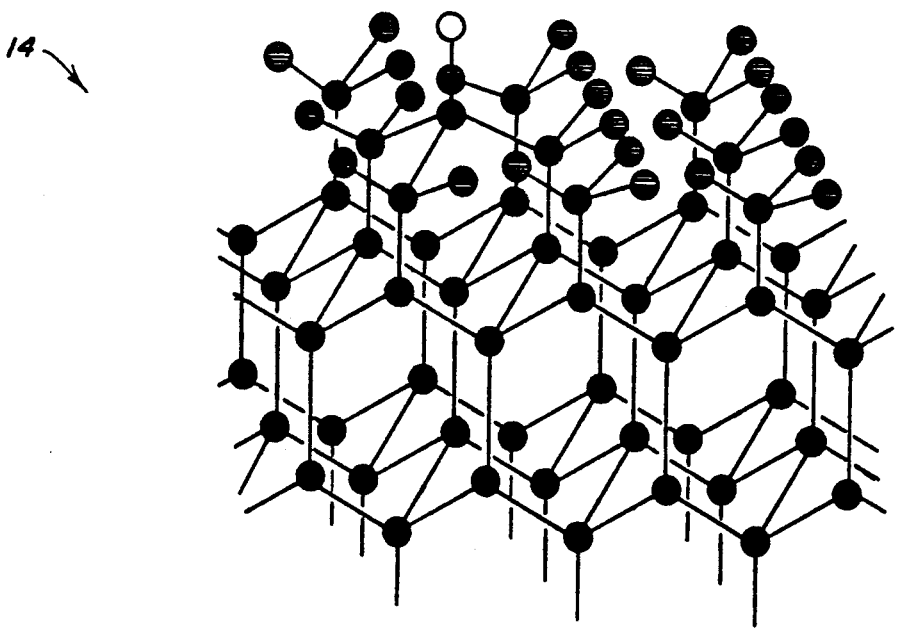
FIG. 3d is the three lattice constants (atoms) wide schematic diagram depiction of FIG. 3c illustrating the first $CH_4$ molecule impinging on the surface thereof, which occurs between the second and third steps of the method according to the present invention.

After being cycled through the first vacuum sub-chamber 28 to remove any surplus physisorbed $CF_4$ molecules, each of the $CF_3$ terminated surfaces of the plurality of substrates 14 is, in turn, now exposed to $CH_4$. The result of the first such $CH_4$ molecule is shown in FIG. 3d. Again the exposure time is dependent on the surface temperature. At the growth temperature of 600 Celsius, exposure time need not exceed 600 milliseconds. During this cycle, three of the four hydrogen atoms are abstracted from the $CH_4$ molecule by surface fluorine atoms requiring 283 kCal/mol. These hydrogen atoms attach to three surface-terminating fluorine atoms on three adjacent $CF_3$ radicals as illustrated by the first such event in FIG. 3d. Formation of the 3 HF molecules (not shown) liberates approximately 405 kCal/mol. FIG. 3d illustrates the first extraction of the three F atoms from the three adjacent $CF_3$ surface-terminating radicals. The bond breaking extraction requires approximately 321 kCal/mol. The dangling bonds on the three (now) $CF_2$ terminating radicals bond with the three dangling bonds from the nascently denuded (now) CF radical liberating approximately 432 kCal/mol. Total energy required in bond breaking is approximately 604 kCal/mol while that liberated in bond making is approximately 837 kCal/mol. The cycle is exothermic by approximately 233 kCal/mol. For each $CH_4$ molecule entering the reaction, 3HF gas molecules (not shown) are created and evacuated by the vacuum pumps 38, 50 and 56. Negligible evaporative cooling occurs by this process. After all of the available fluorine sites have been replaced by $CH_3$ radicals, the surfaces of the plurality of substrates 14 will again appear as in FIG. 3a and no additional $CH_4$ reactions will occur. Sequencing the plurality of substrates 14 through the second vacuum sub-chamber 32 to desorb physisorbed $CH_4$ molecules completes this cycle. The sequential cycling of the plurality of substrates 14 through the first and second vacuum sub-chambers 28 and 32 ensures that any physisorbed boundary layers of the $CF_4$ and $CH_4$ reactant gases are removed, i.e., evacuated, prior to entry into their respective adjacent first and second reactant gas sub-chambers 26 and 30. Accordingly, each surface of the plurality of substrates 14 at the end of this cycle is like that of FIG. 3a from whence the method began. If additional atomic layers are to be grown, the sequential cycling of the plurality of substrates 14 may be repeated. It should be noted that the or14 may be repeated. It should be noted that the order of exposure of the plurality of substrates 14 to the two reactant gases is not critical to the method except as explained hereinafter.

Consequently, ALE growth of diamond is carried out using alternating exposure to halocarbons, e.g., $CF_4$, and hydrocarbons, e.g., $CH_4$, at substrate temperatures between 300 Celsius and 650 Celsius with 600 Celsius being preferred. The stepping motor device 22 is controlled such that the surfaces of the plurality of substrates 14 are given an exposure of at least $10^{15}$ molecules/cm$^2$ of the reactant gases in each of the reactant gas sub-chambers 28 and 30. This exposure duration is dependent on gas flow rates, sub-chamber size, and vacuum pumping capacity, but seldom exceeds 1 second. The chemical reaction time to complete the growth of an individual atom layer is approximately $25 \times 10^{31 \ 6}$ second.

EXAMPLE 2

ALE growth of silicon is carried out using alternating exposure to gaseous compounds of silicon and halogen, e.g., $SiCl_4$ and silicon and hydrogen, e.g., $SiH_4$, at substrate growth temperatures between 240 Celsius and 350 Celsius with 325 Celsius being preferred. Timing and exposure are similar to Example 1 above.

EXAMPLE 3

ALE growth of germanium is carried out using alternating exposure to gaseous compounds of germanium and halogen, e.g., $GeCl_4$, and germanium and hydrogen, e.g., $GeH_4$, at substrate growth temperatures between 200 Celsius and 320 Celsius with 290 Celsius being preferred. Timing and exposure are similar to Example 1 above.

EXAMPLE 4

ALE growth of tin is carried out using alternating exposure to gaseous compounds of tin and halogen, e.g. $SnBr_4$, and tin and hydrogen, e.g., $SnH_4$, at substrate growth temperature between 100 Celsius and 260 Celsius with 200 Celsius being preferred. Timing and exposure are similar to Example 1 above.

EXAMPLE 5

Pb is grown in a manner similar to the procedure shown for Sn in Example 4 above wherein the gases would be $PbI_4$ and $PbH_4$. The substrate growth temperatures would be between 75 Celsius and 175 Celsius with 170 Celsius being preferred.

EXAMPLE 6

Stoichiometric growth of SiC is carried out using alternating exposure to gaseous compounds of silicon and halogen, e.g., $SiCl_4$, and carbon and hydrogen, e.g., $CH_4$. Alternatively, $CCl_4$ and $SiH_4$ may be used. In either case, substrate growth temperatures between 400 Celsius and 600 Celsius are efficacious with 525 Celsius being preferred. Timing, purging and exposure are similar to Example 1 above.

EXAMPLE 7

Non-stoichiometric compounds of the group IVB elements permit the synthesis of semiconductors exhibiting predetermined bandgaps over the range of 0 to 5.5 ev. This is useful for lowering the unwanted dark current (noise) in optical detectors or otherwise maximizing device efficiency. The growth of non-stoichiometric compounds requires that the growth apparatus 10 of FIG. 1 be modified to include an additional reactant gas means. This additional reactant gas means can be added at either of the pipelines 76 or 84. For purposes of the present invention, the additional reactant gas means could include a container, and its associated control valve and flow controller. Of course, the exposure sequence will be controlled by the programmable controller 34. The non-stoichiometric growth of $Si_{0.8} C_{0.2}$ is carried-out using an exposure sequence as follows:
  a. $SiF_4$
  b. $SiH_4$
  c. $SiF_4$
  d. $SiH_4$
  e. $SiF_4$
  f $CH_4$
  g. (repeat the above sequence)
at substrate growth temperatures between 300 Celsius and 500 Celsius with 330 Celsius being preferred. Timing, purging and exposure are similar to Example 1 above.

EXAMPLE 8

Stoichiometric growth of GeSi is carried out using alternating exposure to gaseous compounds of germanium and halogen, e.g., $GeBr_4$, and silicon and hydrogen e.g., $SiH_4$, at substrate growth temperatures between 275 Celsius and 400 Celsius with 310 Celsius being preferred. Timing, purging and exposure are similar to Example 1 above. The preferred purge temperature is 275 Celsius.

EXAMPLE 99

Non-stoichiometry growth of $Si_{0.4} Ge_{0.6}$ is carried out using an exposure sequence as follows:
  a. $SiCl_4$
  b. $SiH_4$
  c. $GeCl_4$
  d. $GeH_4$
  e. $GeCl_4$
  f. $SiH_4$
  g. $SiCl_4$
  h. $GeH_4$
  i. $GeCl_4$
  j $GeH_4$
  k. (repeat the above sequence)
at a substrate growth temperature between 275 Celsius and 400 Celsius with 310 Celsius being preferred.

It should be noted that four separate gas sources are required for such a stoichiometric ratio whereas only two gas sources would be required for a $Si_{0.2} Ge_{0.8}$ stoichiometric ratio similar to Example 7 above. Other timings, purgings and exposures are similar to Example 9 above.

EXAMPLE 10

Stoichiometric SnGe growth is carried out using alternating exposures to gases of tin and halogen, e.g., $SnI_4$, and germanium and hydrogen, e.g., $GeH_4$, at substrate growth temperatures between 180 Celsius and 290 Celsius with 270 Celsius being preferred. Timinq, purging and exposure are similar to that of Example 1 above. Non-stoichiometric GeSn growth is accomplished by means similar to that illustrated in Examples 7 and 8 above. The preferred temperature is 1180 Celsius.

EXAMPLE 11

Stoichiometric growth of GeC is accomplished in a manner similar to Examples above except that $GeF_4$ is substituted for $SiF_4$.

EXAMPLE 12

Non-stoichiometric growth of the materials of Example 11 above is accomplished in a manner similar to Example 9 above except that $CF_4$ is substituted for $SiCl_4$ and $CH_4$ is substituted for $SiH_4$.

FIG. 4 is a functional block diagram which illustrates, in a summary fashion, the essential steps of the method according to the present invention as established by Examples 4 through 5. In addition, the functional block diagram of FIG. 4 contains the processing and decision information needed to program the programmable controller 34 (see FIG. 1). For purposes of the present invention, the programmable controller 34 can be an analog or digital computer which has been programmed to perform the method steps exemplified by Examples 1 through 5 and, accordingly, automatically fabricate the products thereof. To automatically perform the method steps exemplified by Examples 6 through 12, the growth apparatus 10 of FIG. 1 has to be modified to accommodate the additional reactant gas sources. The programmable controller 34 of FIG. 1, then, would have to be programmed to sequence the reactant gas sources according to Examples 6 through 12. The timing and exposure factors are similar to Examples 1 through 5. It should be mentioned that the products of Examples 1 through 12 can be manually fabricated just as effectively as they can be automatically, but clearly not as economically or efficiently.

Referring again to FIGS. 1, 2 and 4 as viewed concurrently, the pre-cleaned plurality of substrates 14 are disposed into the growth reactor chamber 12 via a load lock (not shown) as indicated by process block 86. In sequence, process block 88 indicates activation of the high vacuum purge pump 56 and opening of its associated control valve 58 by the programmable controller 34 to quickly evacuate the growth reactor chamber 12 to a pressure of $10^{31\ 8}$ Torr or less for a period of at least 5 minutes to rid the growth reactor chamber 12 of impurities. As indicated by process block 90, the second high capacity vacuum pump 50 is activated and its control valve 52 is opened to assist the high vacuum purge pump 56 in evacuating hydrogen from the growth reactor chamber 12. Next, and as indicated by process block 92, the purge gas (molecular hydrogen) from the purge gas container 62 is caused to flood the growth reactor chamber 12 by opening of the control valve 64 and activation of flow controller 66 by the programmable controller 34. The programmable controller 34 also operates to activate the substrate heater device as indicated by process block 94 to set the substrate temperature within the purge temperature range of 300 Celsius to 650 Celsius, with a preferred temperature of 300 Celsius.

To continue and as indicated by process Block 96, the RF coil plasma device (not shown) is activated by the programmable controller 34 for a period of about 30 seconds to "strike" a plasma of the molecular hydrogen such that the surfaces of the plurality of substrates 14 are cleaned of all oxides and terminated in hydrogen. As also indicated by process block 96, the RF coil plasma device is then deactivated after the 30 second period. Process block 98 indicates the closing of the control valve 64 and the deactivation of the flow controller 66 after the purge clean operation. Process block 100 indicates the activation of the high capacity vacuum pump 38 and the opening of its associated control value 40 by the programmable controller 34. The high capacity vacuum pumps 38 and 50 maintain the vacuum environment, e.g., 40 to 400 Torr, needed in the growth reactor chamber 12 to carry out the method according to the present invention. The highest pressures are in the reactant gas sub-chambers 26 and 30, and the lowest pressures are in the vacuum sub-chambers 28 and 32. As indicated by process block 102, the substrate heater device 38 is reset by the programmable controller 34 to the proper growth temperature for the material being processed. As explained previously, the growth temperatures fall within a useful range. Thus, a critical temperature uniformity is not as important as it is in most other growth systems.

To continue, the reactant gases from the reactant gas containers 70 and 78 are caused to flow into their respective reactive gas sub-chambers 26 and 30 by the opening of the associated control valves 72 and 80 and the activation of corresponding flow controllers 74 and 82. These actions are indicated by process block 104. Accordingly, and as better shown in FIG. 2, at this point in time, two of the plurality of substrates 14 are disposed in the reactant gas sub-chambers 26 and 30 under the influence of corresponding reactant gases. For diamond these gases are $CF_4$ and $CH_4$, respectively. As shown, the other two of the plurality of substrates 14 are disposed in the adjacent vacuum sub-chambers 28 and 32 which are low pressure regions. As indicated by process block 106, the stepper motor device 22 is activated by the programmable controller 34. The stepper motor device 22 which is operatively connected via the pedestal shaft 18 to the pedestal 16 begins "stepping" the plurality of substrates 14 in such a manner that each one thereof is sequentially positioned in, for example, the reactant gas sub-chamber 26, the vacuum sub-chamber 28, the reactant gas sub-chamber 30 and the vacuum sub-chamber 32. Since the plurality of substrates 14 have been previously hydrogenated, any one thereof initially positioned in the second reactant gas sub-chamber 30 under the influence of the hydrocarbon gas, e.g., $CH_4$, will not grow until it is rotated to the first reactant gas sub-chamber 26 under the influence of the halocarbon gas, e.g., $CF_4$. It will, of course, grow during its second and subsequent exposures to the hydrocarbon gas in the second reactant gas sub-chamber 30. The process can also start alternately or concurrent at the reactant gas sub-chamber 30, but as previously mentioned, no initial growth will occur therein. Consequently, each one of the plurality of substrates 14 is resident in the aforementioned sub-chambers for a duration of time necessary to expose each surface thereof to at least one molecular layer of the impinging reactant gases in either of the reactant gas sub-chambers 26 or 30 and/or to vacuum desorb all but one molecular physisorbed "boundary layer" of the reactant gases from the previous step(s) so as not to impair the extraction/exchange process. The centrifugal forces generated during the step rotation also act to "desorb" physisorbed molecules. The timing will vary depending upon the flow rates of the reactant gases, the resident pressure and temperature in the growth reactor chamber 12 and the physical size thereof. For purposes of the present invention 600 milliseconds under flow of each of the reactant gases and 600 milliseconds each under vacuum desorbing is sufficient when the background system pressure is 40 Torr or lower. The reactant gas steps are self-limiting so that exactly one atomic layer for each reactant gas cycle is grown on the surfaces of the plurality of substrates 14. Thus, of the four plurality of substrates 14 shown, the one initially residing in the first reactant gas sub-chamber 26 will receive one atomic layer of growth prior to rotation of the pedestal 16. During the next 270 degrees rotation of the pedestal 16, each one of the other three plurality of substrates 14 will have grown by one atomic layer. The one of the plurality of substrates 14 that was initially in the first reactant gas sub-chamber 26 will have received an additional atomic layer of growth. For each subsequent 180 degrees rotation of the pedestal 16, all four of the plurality of substrates 14 each will grow an additional atomic layer. Alternatively, by delaying the flow of the hydrocarbon gas into the first reactant gas sub-chamber 30 until the pedestal 16 has rotated its initial 270 degrees, all four of the plurality of substrates 14 will receive equal atomic layers of growth. Once activated, the stepper motor device 22 is configured to "step" through the required number of complete rotations and then stop (automatic deactivation). As indicated by decision block 108, if more atomic layers of growth are desired, the stepper motor device 22 is again activated and the process is repeated. As also indicated by decision block 108 if no more atomic layers of growth are desired, the growth apparatus 10 is secured. This action is indicated by process block 110 wherein the flow controllers 74 and 82 are deactivated, the vacuum pumps 38, 50 and 56 are deactivated, the control valves 72, 80, 40, 52 and 58 are closed, and the heater device 36 is deactivated by operation of the programmable controller 34. As indicated by process block 112, removal of the finished products from the growth reactor chamber 12 completes the process.

To these skilled in the art, many modifications and variations of the present invention are possible in light of the above teachings. It is therefore to be understood that the present invention can be practiced otherwise than as specifically described herein and still be within the spirit and scope of the appended claims.

What is claimed is:

1. A growth apparatus for atomic layer epitaxial (ALE) growth of thin films upon the surfaces of a plurality of substrates of the elemental semiconductors comprising:

a growth reactor chamber means for securing said plurality of substrates therein to allow the growth of thin films upon said surfaces thereof;

a purge means operatively connected to said growth reactor chamber means for evacuating all impurities therefrom and to purge clean said surfaces of said plurality of substrates;

a heater means operatively connected to said growth reactor chamber means for maintaining a predetermined purge temperature within a range of purge temperatures, and a predetermined growth temperature within a range of growth temperatures on said surfaces of said plurality of substrates;

a first reactant gas means operatively connected to said growth reactor chamber means for flooding thereof with a first reactant gas so as to expose said surfaces of said plurality of substrates thereto;

a second reactant gas means operatively connected to said growth reactor chamber means for flooding thereof with a second reactant gas so as to expose said surfaces of said plurality of substrates thereto; and a differential pressure means operatively connected to said growth reactor chamber means for desorbing said surfaces of said plurality of substrates of all physisorbed species of said first and second reactant gases and for maintaining a predetermined purge pressure within a range of purge pressures and a predetermined growth pressure within a range of growth pressures in said growth reactor chamber means.

2. The growth apparatus of claim 1 wherein said growth reactor chamber means further includes:

a first reactant gas sub-chamber integrally affixed to said growth reactor chamber means and operatively connected to said first reactant gas means;

a second reactant gas sub-chamber integrally affixed to said growth reactor chamber means and operatively connected to said second reactant gas means;

a first vacuum sub-chamber integrally affixed to said growth reactor chamber means and said first and second reactant gas sub-chambers, said first vacuum sub-chamber being operatively connected to said differential pressure means; and a second vacuum sub-chamber integrally affixed to said growth reactor chamber means and said first and second reactant gas sub-chambers, said second vacuum sub-chamber being operatively connected to said differential pressure means.

3. The growth apparatus of claim 2 wherein said growth reactor chamber means further includes a tailpipe means integrally affixed to said first and second reactant gas sub-chambers, and said first and second vacuum sub-chambers so as to form a portion thereof, said tailpipe means being operatively connected to said purge means and said differential pressure means.

4. The growth apparatus of claim 3 wherein said tailpipe means further includes:

a first plurality of ventholes configured in said tailpipe means so as to exit into said first vacuum sub-chamber; and a second plurality of ventholes configured in said tail pipe means so as to exit into said second vacuum sub-chamber;

said first and second plurality of ventholes in cooperation with said differential pressure means operating to maintain said first and second vacuum sub-chambers at a lower operating pressure than that of said first and second reactant gas sub-chambers.

5. The growth apparatus of claim 3 wherein said differential pressure means further includes:

a first high capacity vacuum pump operatively connected to said tailpipe means; and a second high capacity vacuum pump operatively connected to said growth reactor chamber means so as to permit said first and second vacuum sub-chambers to operate at a differentially lower pressure than said first and second reactant gas sub-chambers.

6. The growth apparatus of claim 2 wherein said growth reactor chamber means further includes a pedestal being rotatably affixed to said growth reactor chamber means for securing said plurality of substrates and for rotating them through said first and second reactant gas sub-chambers and said first and second vacuum sub-chambers in accordance with a predetermined timing and switching sequence.

7. The growth apparatus of claim 6 wherein said pedestal is operatively connected to a stepper motor device such that said pedestal is rotated in accordance with the predetermined timing and switching sequence.

8. The growth apparatus of claim 1 wherein said purge means further includes:

a high vacuum purge pump means operatively connected to said growth reactor chamber means for evacuating any residual impurities therefrom;

a purge gas means operatively connected to said growth reactor chamber means for flooding thereof with a purge gas so as to expose said surfaces of said plurality of substrates thereto; and a radio frequency coil plasma device operatively connected to said growth reactor chamber device for striking a plasma of said purge gas so as to remove any oxide that may have accumulated and to hydrogenate said surfaces of said plurality of substrates.

9. The growth apparatus of claim 8 wherein said high vacuum purge pump means further includes a purge pump control valve operatively connected between said growth reactor chamber means and said high vacuum purge pump means for adjusting the pressure in said growth reactor chamber means to a predetermined value prior to flooding thereof with said purge gas.

10. The growth apparatus of claim 8 wherein said purge gas means further includes:
   a purge gas container for containing said purge gas;
   a purge gas control valve operatively connected between said growth reactor chamber means and said purge gas container for adjusting the amount of said purge gas available to said growth reactor chamber means; and
   a purge gas flow controller operatively connected between said growth reactor chamber means and said purge gas control valve for adjusting the flow rate of said purge gas to a predetermined value.

11. The growth apparatus of claim 1 wherein said first reactant gas means further includes:
   a first reactant gas container for containing said first reactant gas;
   a first reactant gas control valve operatively connected between said growth reactor chamber means and said first reactant gas container for adjusting the amount of said first reactant gas available to said growth reactor chamber means; and
   a first reactant gas flow controller operatively connected between said growth reactor chamber means and said first reactant gas control valve for adjusting the flow rate of said first reactant gas to a predetermined value.

12. The growth apparatus of claim 1 wherein said second reactant gas means further includes:
   a second reactant gas container for containing said first reactant gas;
   a second reactant gas control valve operatively connected between said growth reactor chamber means and said second reactant gas container for adjusting the amount of said second reactant gas available to said growth reactor chamber means; and
   a second reactant gas flow controller operatively connected between said growth reactor chamber means and said first reactant gas control valve for adjusting the flow rate of said second reactant gas to a predetermined value.

13. The growth apparatus of claim 1 further including a programmable controller operatively connected to said growth reactor chamber means, said purge means, said heater means, said first reactant gas means, said second reactant gas means and said differential pressure means so as to automatically control the ALE growth of said thin films upon said surfaces of said plurality of substrates according to a predetermined program.

* * * * *